United States Patent
Wang et al.

(10) Patent No.: US 11,335,960 B2
(45) Date of Patent: May 17, 2022

(54) CIRCUIT BOARD AND BATTERY MODULE

(71) Applicant: CONTEMPORARY AMPEREX TECHNOLOGY CO., LIMITED, Ningde (CN)

(72) Inventors: Chong Wang, Ningde (CN); Hua Cao, Ningde (CN); Xianchun Zhu, Ningde (CN); Mu Qian, Ningde (CN)

(73) Assignee: CONTEMPORARY AMPEREX TECHNOLOGY CO., LIMITED, Ningde (CN)

( * ) Notice: Subject to any disclaimer, the term of this patent is extended or adjusted under 35 U.S.C. 154(b) by 450 days.

(21) Appl. No.: 16/673,534

(22) Filed: Nov. 4, 2019

(65) Prior Publication Data

US 2020/0203777 A1    Jun. 25, 2020

(30) Foreign Application Priority Data

Dec. 23, 2018    (CN) .......................... 201822168936.1

(51) Int. Cl.
| | | |
|---|---|---|
| *H05K 1/02* | (2006.01) | |
| *H01M 10/42* | (2006.01) | |
| *H01M 10/48* | (2006.01) | |
| *H01M 50/20* | (2021.01) | |

(52) U.S. Cl.
CPC ....... *H01M 10/425* (2013.01); *H01M 10/482* (2013.01); *H01M 50/20* (2021.01); *H05K 1/0254* (2013.01); *H01M 2010/4271* (2013.01); *H01M 2010/4278* (2013.01);
(Continued)

(58) Field of Classification Search
CPC ............ H05K 1/0254; H01M 10/425–10/4285
See application file for complete search history.

(56) References Cited

U.S. PATENT DOCUMENTS

2018/0198110 A1    7/2018    Zeng

FOREIGN PATENT DOCUMENTS

| CN | 203968491 U | 11/2014 |
|---|---|---|
| CN | 204011598 U | 12/2014 |
| CN | 20424315 6 U | 4/2015 |

(Continued)

OTHER PUBLICATIONS

Contemporary Amperex Technology Co., Limited, Extended European Search Report EP19207858.2, dated May 15, 2020, 8 pgs.

(Continued)

*Primary Examiner* — Jeremy C Norris
(74) *Attorney, Agent, or Firm* — Morgan, Lewis & Bockius LLP

(57) ABSTRACT

The present disclosure provides a battery module comprising a circuit board, the circuit board comprises a conductive layer, a first pad and a second pad. The conductive layer is formed with a sampling circuit, the sampling circuit comprises: a sampling end portion; an outputting end portion; a first branch path formed with a first fusing zone; and a second branch path formed with a second fusing zone. The first pad is provided on the sampling end portion, the second pad is provided on the second branch path. When the first fusing zone is fused, the circuit board can be quickly repaired by means of the second branch path and the second pad to electrically connect the sampling end portion and the outputting end portion, thereby achieving the purpose of reusing the circuit board, therefore the entire battery module is not scrapped and the utilization of the battery module is improved.

20 Claims, 5 Drawing Sheets

(52) U.S. Cl.
CPC ..... *H01M 2220/20* (2013.01); *H05K 2201/05* (2013.01); *H05K 2201/10037* (2013.01)

(56) References Cited

FOREIGN PATENT DOCUMENTS

| CN | 207502073 U | 6/2018 |
| CN | 208754586 U | 4/2019 |
| DE | 1905490 A1 | 8/1970 |
| JP | S56114572 U | 9/1981 |

OTHER PUBLICATIONS

Contemporary Amperex Technology Co., Limited, International Search Report, PCT/CN2019/123696, dated Feb. 25, 2020, 10 pgs.

CIRCUIT BOARD AND BATTERY MODULE

CROSS-REFERENCE To RELATED APPLICATIONS

The present application claims priority to Chinese patent application No. CN201822168936.1, filed on Dec. 23, 2018, which is incorporated herein by reference in its entirety.

FIELD OF THE PRESENT DISCLOSURE

The present disclosure relates to the field of battery sampling technology, and particularly relates to a battery module, a using method of a circuit board and a vehicle.

BACKGROUND OF THE PRESENT DISCLOSURE

In a battery module, it is usually to sample the voltage and temperature of the battery by the FPC, and in order to ensure the safety and reliability of the low-voltage electrical connection during the sampling process, a fusing zone is usually provided in the sampling circuit of the FPC (as shown in FIG. 1 and FIG. 2, 11' is the sampling end portion of the sampling circuit, 12' is the outputting end portion of the sampling circuit, S' is the fusing zone, 2' is the pad, 6' is the insulating film). However, once the fusing zone in the sampling circuit is fused, the sampling will fail and cause the entire FPC or even the entire battery module to be scrapped.

SUMMARY OF THE PRESENT DISCLOSURE

In view of the problem existing in the background, an object of the present disclosure is to provide a battery module, a using method of a circuit board and a vehicle, the circuit board of the battery module has a simple structure and can be reused, thereby improving the utilization of the battery module.

In order to achieve the above object, in a first aspect, the present disclosure provides a battery module, which comprises a circuit board and a plurality of batteries arranged side by side. The circuit board is provided above the plurality of batteries and electrically connected with the corresponding battery. The circuit board comprises a conductive layer, a first pad and a second pad. The conductive layer is formed with a sampling circuit, and the sampling circuit comprises: a sampling end portion; an outputting end portion; a first branch path connected with the sampling end portion and the outputting end portion and formed with a first fusing zone; and a second branch path formed with a second fusing zone, one end of the second branch path is connected with the sampling end portion or a portion of the first branch path except the first fusing zone, and the other end of the second branch path is spaced apart from the sampling end portion and the first branch path. The first pad is provided on the sampling end portion, and the second pad is provided on the other end of the second branch path.

After the first fusing zone of the first branch path is fused, the second pad is connected to the first pad via a conductive connecting member.

The circuit board further comprises a third pad provided at one side of the first fusing zone of the first branch path.

The one end of the second branch path is connected to the sampling end portion or is connected to the first branch path at a position between the sampling end portion and the first fusing zone. The third pad is provided between the first fusing zone and the outputting end portion.

The one end of the second branch path is connected to the first branch path at a position between the outputting end portion and the first fusing zone. The third pad is provided between the first fusing zone and the sampling end portion.

After the first fusing zone of the first branch path is fused, the second pad is connected to the third pad via a conductive connecting member.

The second branch path is provided as one or multiple in number.

The sampling circuits is provided as one or multiple in number. In addition, a protective adhesive is attached to a surface of the second pad.

In a second aspect, the present disclosure further provides a using method of a circuit board, and the circuit board comprises a conductive layer, a first pad, a second pad and a third pad. The conductive layer is formed with a sampling circuit, and the sampling circuit comprises: a sampling end portion; an outputting end portion; a first branch path connected with the sampling end portion and the outputting end portion and formed with a first fusing zone; and a second branch path formed with a second fusing zone, one end of the second branch path is connected with the sampling end portion or a portion of the first branch path except the first fusing zone, and the other end of the second branch path is spaced apart from the sampling end portion and the first branch path. The first pad is provided on the sampling end portion, the second pad is provided on the other end of the second branch path, and the third pad is provided at one side of the first fusing zone of the first branch path. The using method of the circuit board comprises steps of: after the first fusing zone of the first branch path is fused, making the second pad connected to the first pad via a conductive connecting member, so as to make the second fusing zone of the second branch path electrically connected to the sampling end portion and the outputting end portion; or after the first fusing zone of the first branch path is fused, making the second pad connected to the third pad via a conductive connecting member, so as to make the second fusing zone of the second branch path electrically connected to the sampling end portion and the outputting end portion.

In a third aspect, the present disclosure further provides a vehicle, which comprises the battery module described above.

The present disclosure has the following beneficial effects: during the sampling process of the circuit board, the first pad transmits the collected signal to the external controller via the sampling end portion of the sampling circuit, the first branch path and the outputting end portion. When the first fusing zone of the first branch path is fused (at this time the sampling end portion of the sampling circuit and the outputting end portion are disconnected), because the sampling circuit is further provided with the second branch path, the circuit board can be quickly repaired by means of the second branch path and the second pad to electrically connect the sampling end portion and the outputting end portion during the return repair of the battery module, thereby achieving the purpose of reusing the circuit board, therefore the entire battery module is not scrapped and the utilization of the battery module is improved. Moreover, the second fusing zone of the second branch path is used to protect the circuit board and the battery module again.

Figure 1:
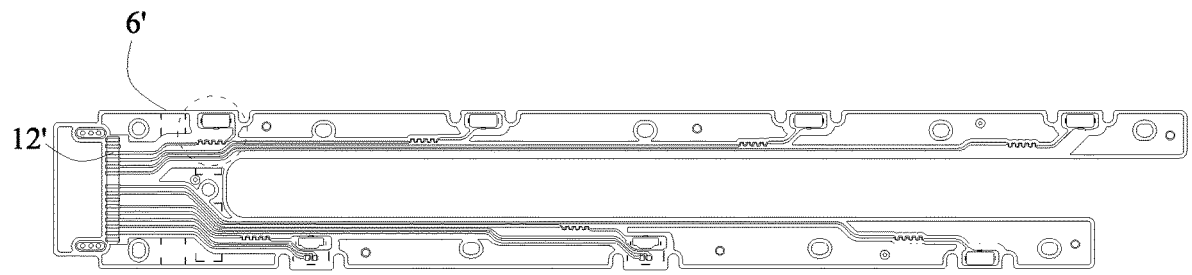
FIG. 1 is a schematic view of a circuit board of the prior art.
Figure 2:
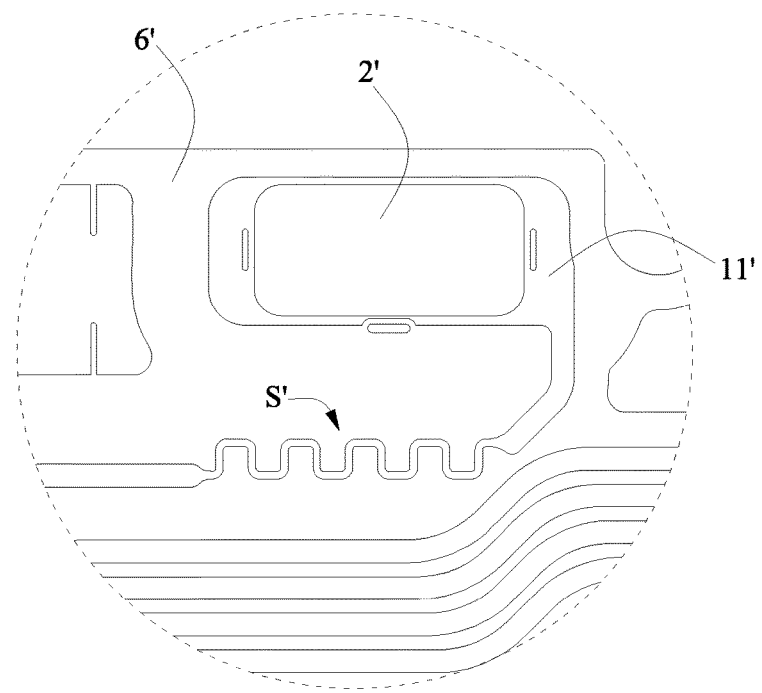
FIG. 2 is an enlarged view of a part of FIG. 1 indicated by a circle.

Reference numerals in figures are represented as follows:
1 circuit board
  11 sampling circuit
    111 sampling end portion
    112 outputting end portion
    113 first branch path
    114 second branch path
    S11 first fusing zone
    S12 second fusing zone
  12 first pad
  13 second pad
  14 third pad
  15 conductive connecting member
  16 insulating film
2 battery
3 electrical connecting sheet
4 conductive sheet

DETAILED DESCRIPTION

To make the object, technical solutions, and advantages of the present disclosure more apparent, hereinafter the present disclosure will be further described in detail in combination with the accompanying figures and the embodiments. It should be understood that the specific embodiments described herein are merely used to explain the present disclosure but are not intended to limit the present disclosure.

In the description of the present disclosure, unless otherwise specifically defined and limited, the terms "first", "second", "third" are only used for illustrative purposes and are not to be construed as expressing or implying a relative importance. The term "plurality" is two or more. Unless otherwise defined or described, the terms "connect", "fix" should be broadly interpreted, for example, the term "connect" can be "fixedly connect", "detachably connect", "integrally connect", "electrically connect" or "signal connect". The term "connect" also can be "directly connect" or "indirectly connect via a medium". For the persons skilled in the art, the specific meanings of the abovementioned terms in the present disclosure can be understood according to the specific situation.

In the description of the present disclosure, it should be understood that spatially relative terms, such as "above", "below" and the like, are described based on orientations illustrated in the figures, but are not intended to limit the embodiments of the present disclosure.

Figure 3:
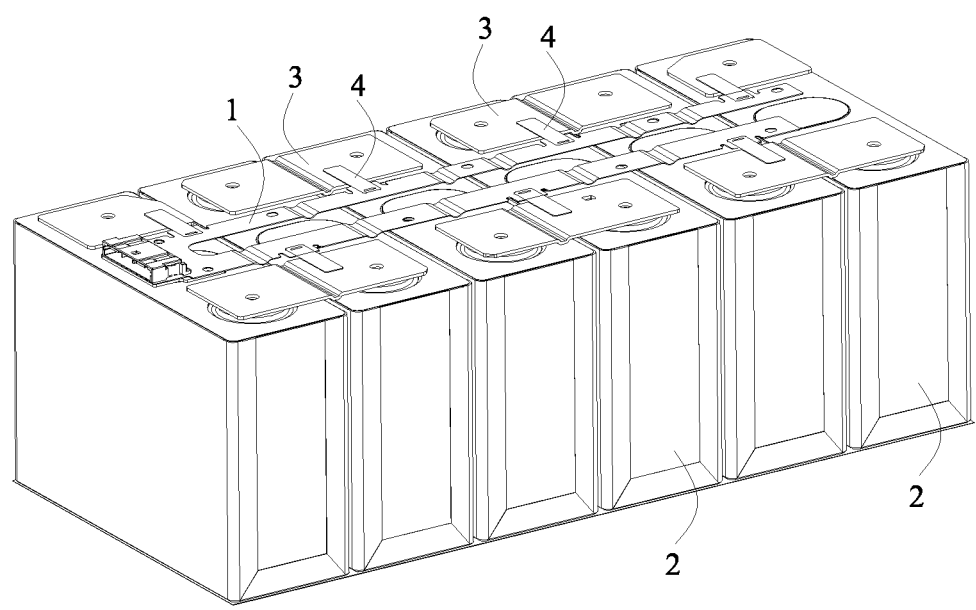
FIG. 3 is a perspective view of a battery module of the present disclosure.
Figure 4:
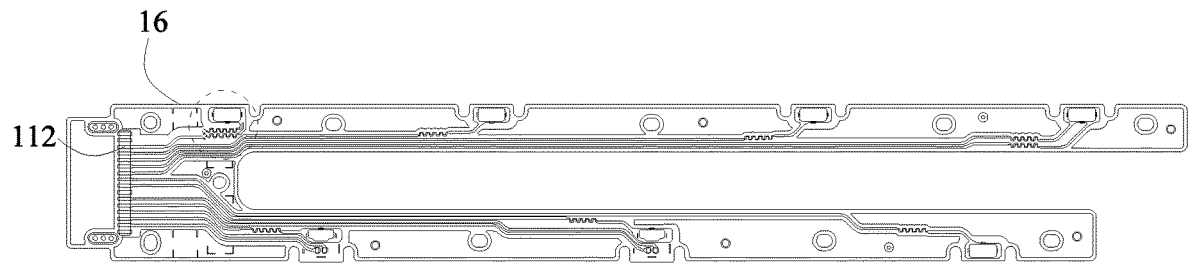
FIG. 4 is a schematic view of a circuit board of the present disclosure, for the sake of clarity, only an insulating film on one side in a thickness direction of the circuit board is shown.
Figure 5:
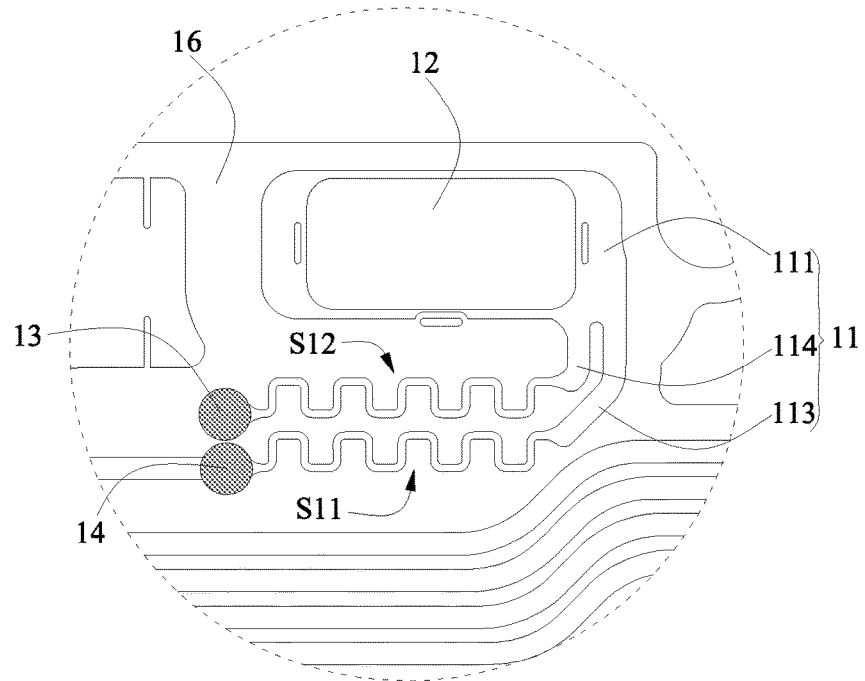
FIG. 5 is an enlarged view of a part of FIG. 4 indicated by a circle.

Referring to FIG. 3, a vehicle of the present disclosure comprises a battery module, and the battery module comprises a plurality of batteries 2, a circuit board 1, a plurality of electrical connecting sheets 3 and a conductive sheet 4.

The plurality of batteries 2 are arranged side by side and electrically connected together by the plurality of electrical connecting sheets 3. The number of the conductive sheets 4 can be provided according to the number of the batteries 2 which are collected in temperature and/or voltage. The circuit board 1 is provided above the plurality of batteries 2 and electrically connected with the corresponding electrical connecting sheet 3 via the corresponding conductive sheet 4 to collect the temperature and/or voltage of the corresponding battery 2.

The circuit board 1 may be a flexible printed circuit (abbreviated as FPC). Specifically, referring to FIG. 3 to FIG. 9, the circuit board 1 comprises a conductive layer, a first pad 12, a second pad 13, a third pad 14, a conductive connecting member 15 and an insulating film 16.

The conductive layer of the circuit board 1 may be made of a metal material (such as a copper foil or an aluminum foil), and the conductive layer may be formed with one or multiple sampling circuits 11. Each sampling circuit 11 is electrically connected with the corresponding electrical connecting sheet 3 via the corresponding conductive sheet 4 to collect the temperature and/or voltage of the corresponding battery 2.

Referring to FIG. 4 to FIG. 9, the sampling circuit 11 comprises: a sampling end portion 111; an outputting end portion 112 connected with an external controller; a first branch path 113 connected with the sampling end portion 111 and the outputting end portion 112 and formed with a first fusing zone S11; and a second branch path 114 formed with a second fusing zone S12, one end of the second branch path 114 is connected with the sampling end portion 111 or a portion of the first branch path 113 except the first fusing zone S11, and the other end of the second branch path 114 is spaced apart from the sampling end portion 111 and the first branch path 113.

The first pad 12 is provided on the sampling end portion 111 of the sampling circuit 11 and connected with the conductive sheet 4 to collect the temperature and/or voltage of the battery 2. The second pad 13 is provided on the other end of the second branch path 114. The first pad 12 and the second pad 13 are identical with the sampling circuit 11 in number.

During the sampling process of the circuit board 1, the first pad 12 transmits the collected signal to the external controller via the sampling end portion 111, the first branch path 113 and the outputting end portion 112 of the sampling circuit 11. When the first fusing zone S11 of the first branch path 113 is fused (at this time the sampling end portion 111 and the outputting end portion 112 of the sampling circuit 11 are disconnected), because the sampling circuit 11 is further provided with the second branch path 114, the circuit board 1 can be quickly repaired by means of the second branch path 114 and the second pad 13 to electrically connect the sampling end portion 111 and the outputting end portion 112 during the return repair of the battery module, thereby achieving the purpose of reusing the circuit board 1, therefore the entire battery module is not scrapped and the utilization of the battery module is improved. Moreover, the second fusing zone S12 of the second branch path 114 is used to protect the circuit board 1 and the battery module again.

The second branch path 114 may be manufactured in the same manufacturing process as the first branch path 113 to simplify the manufacturing process and improve the production efficiency of the circuit board 1. Moreover, the second branch path 114 is not limited to one in number and may be provided as multiple depending on the size of the circuit board 1.

After the first fusing zone S11 of the first branch path 113 is fused, the quickly repair methods of the circuit board 1 repaired by the second branch path 114 and the second pad 13 during the return repair of the battery module are as follows, and the third pad 14 can be selectively provided based on different repair methods which are specifically described below.

Figure 8:
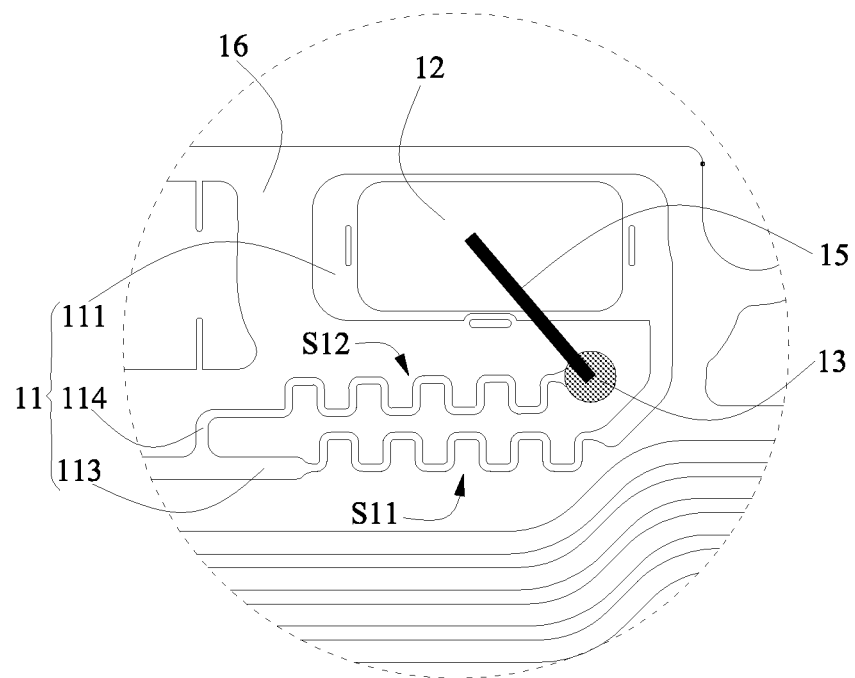
FIG. 8 is a variation view of FIG. 7.

In a first embodiment, referring to FIG. 8, after the first fusing zone S11 of the first branch path 113 is fused, the second pad 13 is connected to the first pad 12 via the conductive connecting member 15, and at this time the sampling end portion 111 is electrically connected with the outputting end portion 112 via the first pad 12, the conductive connecting member 15, the second pad 13 and the second branch path 114 in sequence. Here, because the conductive connecting member 15 directly connects the second pad 13 and the first pad 12, it is not necessary to provide the third pad 14, thereby simplifying the structure and manufacturing process of the circuit board 1.

In order to reduce the length of the conductive connecting member 15, preferably, the one end of the second branch path 114 is connected to the first branch path 113 at a position between the outputting end portion 112 and the first fusing zone S11, so as to make the second pad 13 provided on the other end of the second branch path 114 close to the first pad 12.

Figure 6:
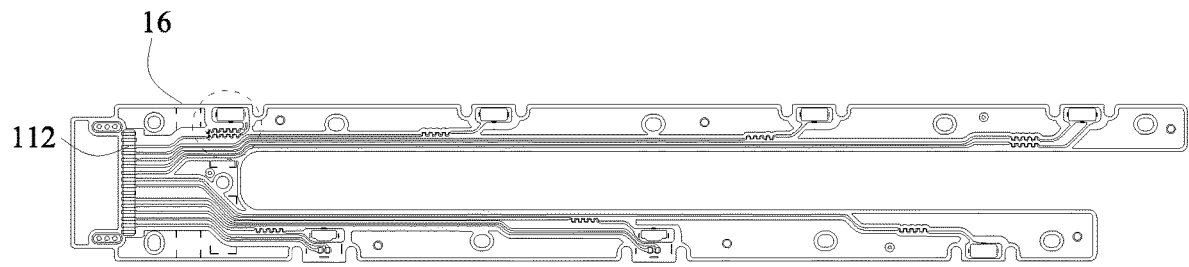
FIG. 6 is a schematic view illustrating the repair of the circuit board of FIG. 4.
Figure 7:
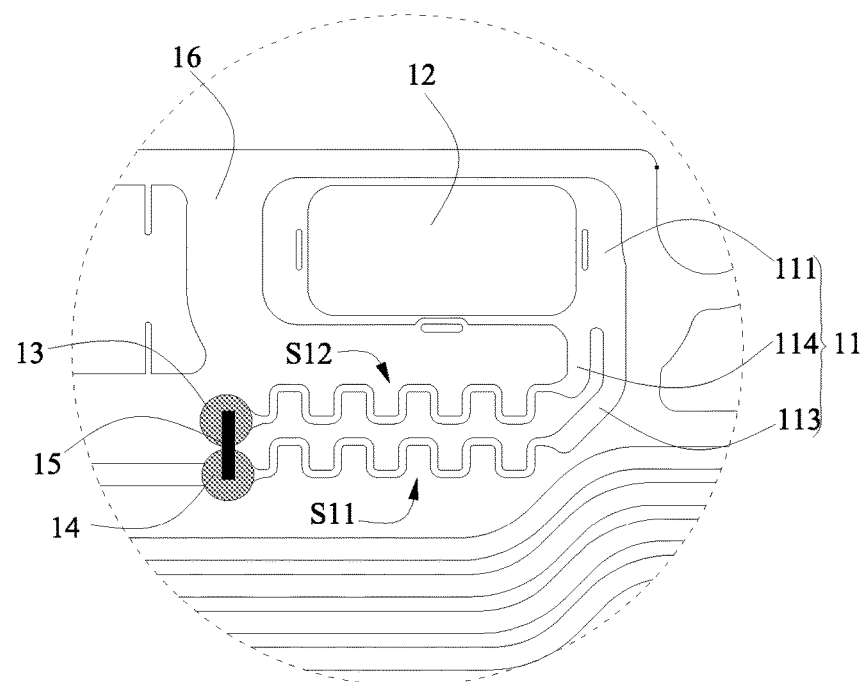
FIG. 7 is an enlarged view of a part of FIG. 6 indicated by a circle.

In a second embodiment, referring to FIG. 6 and FIG. 7, the one end of the second branch path 114 is directly connected to the sampling end portion 111 or is connected to the first branch path 113 at a position between the sampling end portion 111 and the first fusing zone S11, and the third pad 14 is provided between the first fusing zone S11 and the outputting end portion 112, so as to make the third pad 14 close to the second pad 13, thereby helping to reduce the length of the conductive connecting member 15.

After the first fusing zone S11 of the first branch path 113 is fused, the second pad 13 is connected to the third pad 14 via the conductive connecting member 15, and at this time the sampling end portion 111 is electrically connected to the outputting end portion 112 via the second branch path 114, the second pad 13, the conductive connecting member 15, the third pad 14 and the outputting end portion 112 in sequence. Here, based on the arrangement of the third pad 14, the formation position of the second branch path 114 does not need to depend on the position of the first pad 12, and at the same time because the conductive connecting member 15 is not directly connected to the first pad 12, thereby avoiding the effect of multiple connections (e.g., welding) on the first pad 12 (which is subsequently connected to the conductive sheet 4).

Figure 9:
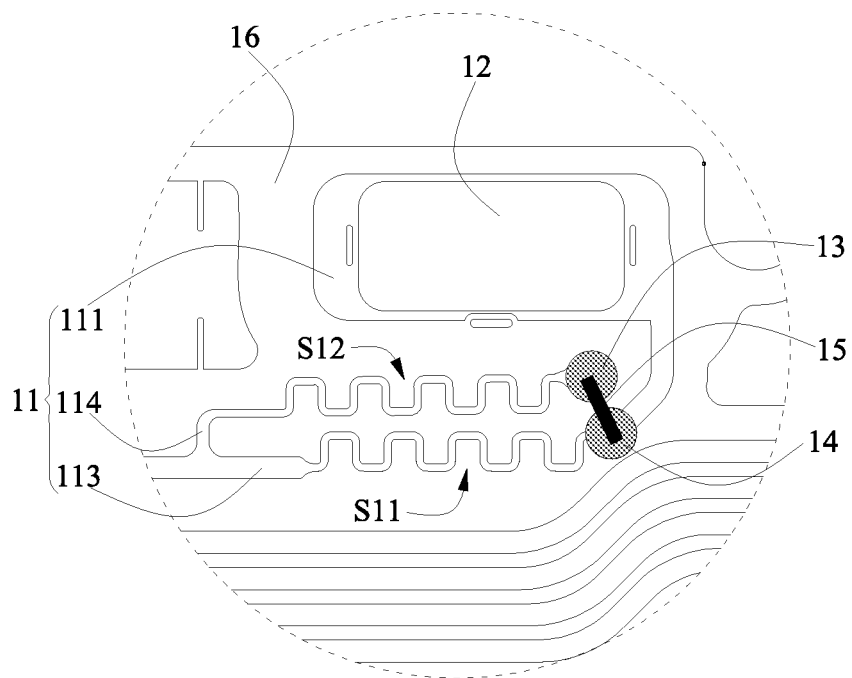
FIG. 9 is another variation view of FIG. 7.

In a third embodiment, referring to FIG. 9, the one end of the second branch path 114 is connected to the first branch path 113 at a position between the outputting end portion 112 and the first fusing zone S11, and the third pad 14 is provided between the first fusing zone S11 and the sampling end portion 111, so as to make the third pad 14 close to the second pad 13, thereby helping to reduce the length of the conductive connecting member 15.

After the first fusing zone S11 of the first branch path 113 is fused, the second pad 13 is connected to the third pad 14 via the conductive connecting member 15, and at the same time the sampling end portion 111 is electrically connected to the outputting end portion 112 via the third pad 14, the conductive connecting member 15, the second pad 13 and the second branch path 114 in sequence. Here, based on the arrangement of the third pad 14, the formation position of the second branch path 114 does not need to depend on the position of the first pad 12, and at the same time because the conductive connecting member 15 is not directly connected to the first pad 12, thereby avoiding the effect of multiple connections on the first pad 12.

It should be noted that, the first pad 12, the second pad 13 and the third pad 14 may be integrally formed with the sampling circuit 11, or the first pad 12, the second pad 13 and the third pad 14 may be made of the same material as the sampling circuit 11 and connected to the sampling circuit 11 (e.g., welded, electrically bonded, press jointed etc.), or the first pad 12, the second pad 13 and the third pad 14 may be made of a metal material or an alloy material different from the sampling circuit 11 and connected to the sampling circuit 11. Moreover, the shapes of the first pad 12, the second pad 13 and the third pad 14 may be circular, elliptical, square and the like.

The conductive connecting member 15 is made of a metal material, the conductive connecting member 15 may specifically be a conductive wire, an aluminum wire, a copper wire, a nickel wire, a soldering tin and the like, and the connection method among the conductive connecting member 15, the first pad 12 and the second pad 13 or among the conductive connecting member 15, the second pad 13 and the third pad 14 may be welding, electrically bonding, press jointing and the like.

In order to protect the conductive layer, an outer side of the conductive layer is covered with the insulating film 16. The first pad 12, the second pad 13 and the third pad 14 are exposed on the insulating film 16 to facilitate connection of them with other electrical connection members.

In order to protect the first pad 12, the second pad 13 and the third pad 14, a protective adhesive may be attached to the surfaces of them, and when they are required to be connected with other electrical connection members, the protective adhesive can be directly removed. Moreover, in order to ensure the connection reliability of the connection portions among the conductive connecting member 15, the first pad 12 and the second pad 13, or among the conductive connecting member 15, the second pad 13 and the third pad 14, the connection portion also can be attached with the protective adhesive. The protective adhesive may be a heat-resistance adhesive tape or a protective coating layer adhesive.

Finally, a using method of the circuit board 1 will be described, and the circuit board 1 comprises a conductive layer, a first pad 12, a second pad 13 and a third pad 14. The conductive layer is formed with a sampling circuit 11, and the sampling circuit 11 comprises: a sampling end portion 111; an outputting end portion 112; a first branch path 113 connected with the sampling end portion 111 and the outputting end portion 112 and formed with a first fusing zone S11; and a second branch path 114 formed with a second fusing zone S12, one end of the second branch path 114 is connected with the sampling end portion 111 or a portion of the first branch path 113 except the first fusing zone S11, and the other end of the second branch path 114 is spaced apart from the sampling end portion 111 and the first branch path 113. The first pad 12 is provided on the sampling end portion 111, the second pad 13 is provided on the other end of the second branch path 114, and the third pad 14 is provided at one side of the first fusing zone S11 of the first branch path 113. Specifically, the using method of the circuit board 1 comprises steps of: after the first fusing zone S11 of the first branch path 113 is fused, making the second pad 13 connected to the first pad 12 via a conductive connecting member 15, to make the second fusing zone S12 of the second branch path 114 electrically connected to the sampling end portion 111 and the outputting end portion 112; or after the first fusing zone S11 of the first branch path 113 is fused, making the second pad 13 connected to the third pad 14 via a conductive connecting member 15, to make the second fusing zone S12 of the second branch path 114 electrically connected to the sampling end portion 111 and the outputting end portion 112.

What is claimed is:

1. A battery module, comprising a circuit board and a plurality of batteries arranged side by side, the circuit board being provided above the plurality of batteries and electrically connected with the corresponding battery, and the circuit board comprising:
a conductive layer formed with a sampling circuit, and the sampling circuit comprising: a sampling end portion; an outputting end portion; a first branch path connected with the sampling end portion and the outputting end portion and formed with a first fusing zone; and a second branch path formed with a second fusing zone, one end of the second branch path being connected with the sampling end portion or a portion of the first branch path except the first fusing zone, and the other end of the second branch path being spaced apart from the sampling end portion and the first branch path;
a first pad provided on the sampling end portion;
a second pad provided on the other end of the second branch path.

2. The battery module according to claim 1, wherein after the first fusing zone of the first branch path is fused, the second pad is connected to the first pad via a conductive connecting member.

3. The battery module according to claim 1, wherein the circuit board further comprises a third pad provided at one side of the first fusing zone of the first branch path.

4. The battery module according to claim 3, wherein
the one end of the second branch path is connected to the sampling end portion or the one end of the second branch path is connected to the first branch path at a position between the sampling end portion and the first fusing zone;
the third pad is provided between the first fusing zone and the outputting end portion.

5. The battery module according to claim 4, wherein after the first fusing zone of the first branch path is fused, the second pad is connected to the third pad via a conductive connecting member.

6. The battery module according to claim 3, wherein
the one end of the second branch path is connected to the first branch path at a position between the outputting end portion and the first fusing zone;
the third pad is provided between the first fusing zone and the sampling end portion.

7. The battery module according to claim 6, wherein after the first fusing zone of the first branch path is fused, the second pad is connected to the third pad via a conductive connecting member.

8. The battery module according to claim 1, wherein the second branch path is provided as one or multiple in number.

9. The battery module according to claim 1, wherein the sampling circuits is provided as one or multiple in number.

10. The battery module according to claim 1, wherein a protective adhesive is attached to a surface of the second pad.

11. A using method of a circuit board, wherein the circuit board comprises a conductive layer, a first pad, a second pad and a third pad;
the conductive layer is formed with a sampling circuit, and the sampling circuit comprises: a sampling end portion; an outputting end portion; a first branch path connected with the sampling end portion and the outputting end portion and formed with a first fusing zone; and a second branch path formed with a second fusing zone, one end of the second branch path is connected with the sampling end portion or a portion of the first branch path except the first fusing zone, and the other end of the second branch path is spaced apart from the sampling end portion and the first branch path;
the first pad is provided on the sampling end portion;
the second pad is provided on the other end of the second branch path;
the third pad is provided at one side of the first fusing zone of the first branch path;
wherein the using method of the circuit board comprises steps of:
after the first fusing zone of the first branch path is fused, making the second pad connected to the first pad via a conductive connecting member, to make the second fusing zone of the second branch path electrically connected to the sampling end portion and the outputting end portion; or
after the first fusing zone of the first branch path is fused, making the second pad connected to the third pad via a conductive connecting member, to make the second fusing zone of the second branch path electrically connected to the sampling end portion and the outputting end portion.

12. A vehicle, comprising a battery module, and the battery module comprising a circuit board and a plurality of batteries arranged side by side, the circuit board being provided above the plurality of batteries and electrically connected with the corresponding battery, wherein
the circuit board comprises a conductive layer, a first pad and a second pad;
the conductive layer is formed with a sampling circuit, and the sampling circuit comprises: a sampling end portion; an outputting end portion; a first branch path connected with the sampling end portion and the outputting end portion and formed with a first fusing zone; and a second branch path formed with a second fusing zone, one end of the second branch path is connected with the sampling end portion or a portion of the first branch path except the first fusing zone, and the other end of the second branch path is spaced apart from the sampling end portion and the first branch path;
the first pad is provided on the sampling end portion, and the second pad is provided on the other end of the second branch path.

13. The vehicle according to claim 12, wherein after the first fusing zone of the first branch path is fused, the second pad is connected to the first pad via a conductive connecting member.

14. The vehicle according to claim 12, wherein the circuit board comprises a third pad provided at one side of the first fusing zone of the first branch path.

15. The vehicle according to claim 14, wherein
the one end of the second branch path is connected to the sampling end portion or is connected to the first branch path at a position between the sampling end portion and the first fusing zone;

the third pad is provided between the first fusing zone and the outputting end portion.

16. The vehicle according to claim 15, wherein after the first fusing zone of the first branch path is fused, the second pad is connected to the third pad via a conductive connecting member.

17. The vehicle according to claim 14, wherein
the one end of the second branch path is connected to the first branch path at a position between the outputting end portion and the first fusing zone;
the third pad is provided between the first fusing zone and the sampling end portion.

18. The vehicle according to claim 17, wherein after the first fusing zone of the first branch path is fused, the second pad is connected to the third pad via a conductive connecting member.

19. The vehicle according to claim 12, wherein the second branch path is provided as one or multiple in number.

20. The vehicle according to claim 12, wherein a protective adhesive is attached to a surface of the second pad.

* * * * *